United States Patent [19]
Furumiya

[11] Patent Number: 5,298,798
[45] Date of Patent: Mar. 29, 1994

[54] AMPLITUDE CONTROL DEVICE

[75] Inventor: Shigeru Furumiya, Katano, Japan

[73] Assignee: Matsushita Electric Industrial Co., Ltd., Osaka, Japan

[21] Appl. No.: 922,180

[22] Filed: Jul. 30, 1992

[30] Foreign Application Priority Data

Jul. 31, 1991 [JP] Japan .................... 3-191600

[51] Int. Cl.⁵ .................... H03K 5/08; H04N 5/52
[52] U.S. Cl. .................... 307/264; 307/359; 307/493; 348/645; 348/678
[58] Field of Search .............. 307/264, 358, 359, 493; 340/146.2; 358/21 R, 34, 35, 156, 174, 27

[56] References Cited

U.S. PATENT DOCUMENTS

| | | | |
|---|---|---|---|
| 4,466,015 | 8/1984 | Wargo et al. | 358/27 |
| 4,514,754 | 4/1985 | Nillesen et al. | 358/13 |
| 4,636,852 | 1/1987 | Farmer | 358/120 |
| 5,136,382 | 8/1992 | Meyer | 307/359 |
| 5,185,538 | 2/1993 | Kondoh et al. | 307/264 |

Primary Examiner—John Zazworsky
Attorney, Agent, or Firm—Ratner & Prestia

[57] ABSTRACT

An amplitude control device for controlling an amplitude of a data signal having an reference amplitude includes an A/D converter which converts the data signal to an n-bit digital signal, an extraction circuit for extracting the reference amplitude from the n-bit digital signal, a compactor for comparing the extracted reference amplitude with a predetermined amplitude to produce a first signal when the extracted reference amplitude is greater than the predetermined amplitude, and a second signal when the extracted reference amplitude is smaller than the predetermined amplitude. A counter counts up and down on receipt of the first signal and second signal, respectively, and produces an m-bit digital signal representing the counting result. A ROM stores a table in which the n-bit digital signal and the m-bit digital signal are used as an address for designating a value equal to the n-bit digital signal multiplied by a coefficient determined by the m-bit digital signal.

2 Claims, 4 Drawing Sheets

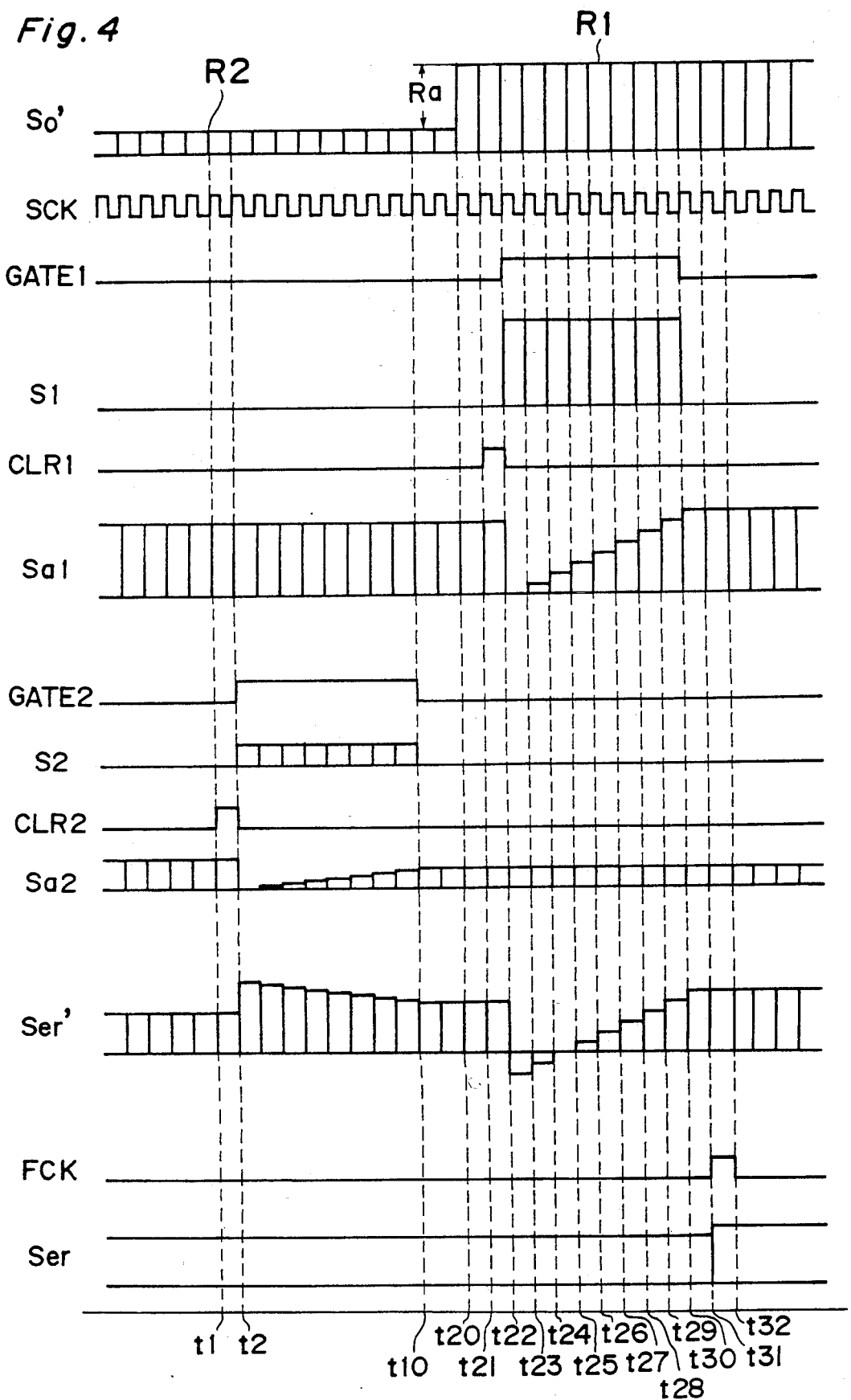

AMPLITUDE CONTROL DEVICE

BACKGROUND OF THE INVENTION

1. Field of the Invention

The present invention relates to an amplitude control device for automatically controlling the amplitude of a digital signal and, more particularly, to an amplitude control device for a digital signal comprising an amplitude reference signal component time-base multiplexed thereto.

2. Description of the Prior Art

An automatic gain control device is often used to obtain the correct amplitude in a digital signal resulting from analog/digital (A/D) conversion of an analog signal such as a video signal. The most common automatic gain control method used during A/D conversion is a feedback control method whereby an amplitude reference signal is time-base multiplexed to the input analog signal and referenced to obtain the specified signal amplitude in the output digital signal.

There are two primary signal amplitude control methods: directly controlling the signal amplitude before A/D conversion using a variable gain analog amplifier; and controlling the digital signal after conversion by regulating the reference voltage of the A/D converter to vary the input dynamic range of the A/D converter.

There are drawbacks to each of these known methods, however. With the former method, the analog variable gain device must be adjusted after assembly to assure correct operation. With the latter method the signal to noise (S/N) ratio deteriorates because the dynamic range of the A/D converter is used at a less than optimum band width.

SUMMARY OF THE INVENTION

The object of the present invention is therefore to provide an amplitude control device which solves these problems.

The present invention has been developed with a view to substantially solving the above described disadvantages and has for its essential object to provide an improved amplitude control device.

In order to achieve the aforementioned objective, an amplitude control device for controlling an amplitude of a data signal having an reference amplitude comprises an analog-digital conversion means for converting said data signal to an n-bit digital signal; an amplitude extraction means for extracting said reference amplitude from said n-bit digital signal; a comparison means for comparing said extracted reference amplitude with a predetermined reference amplitude, and producing a first comparison signal when said extracted reference amplitude is greater than said predetermined reference amplitude, and a second comparison signal when said extracted reference amplitude is smaller than said predetermined reference amplitude; a counter means for counting up on receipt of said first comparison signal and counting down on receipt of said second comparison signal, and for producing an m-bit digital signal representing said counting result; and a memory means for storing a table in which said n-bit digital signal and said m-bit digital signal are used as an address for designating a value equal to said n-bit digital signal multiplied by a coefficient determined by said m-bit digital signal.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

The present invention will become more fully understood from the detailed description given below and the accompanying diagrams wherein:

FIG. 4 is a graph showing waveforms of signals observed at various places in the amplitude control device shown in FIG. 1.

DETAILED DESCRIPTION OF THE PREFERRED EMBODIMENTS

Figure 3:
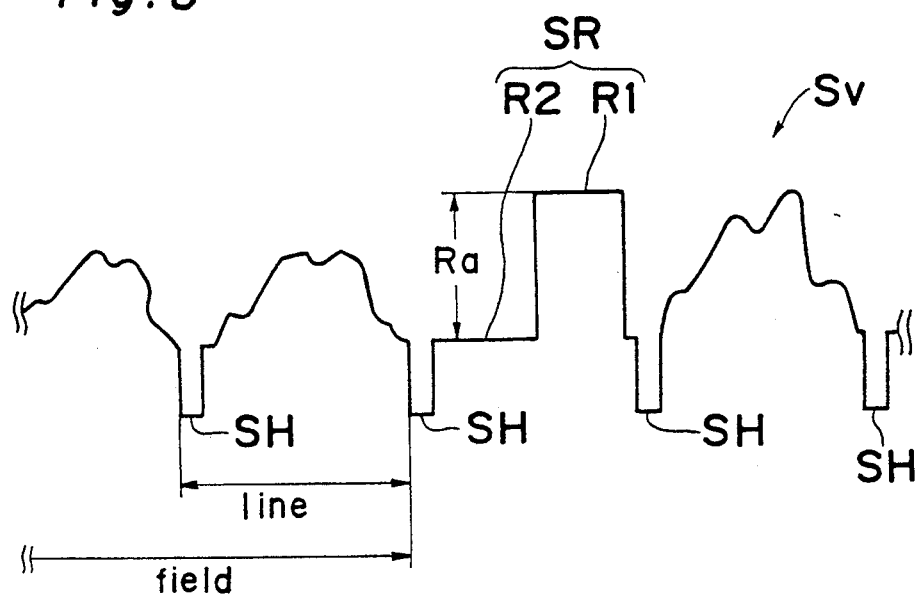
FIG. 3 is a graph showing a waveform of an analog vide signal processed by the amplitude control device shown in FIG. 1.

The digital video signal Si is converted from an analogue video signal Sv (FIG. 3), which has a reference signal SR in the vertical blanking periods and a horizontal synchronizing signal SH in the horizontal blanking periods. The reference signal SR includes a first and a second reference amplitudes R1 and R2. The first reference amplitude R1 is greater than the second reference amplitude R2 and the difference therebetween is used as a reference amplitude Ra. The analog video signal Sv is sampled by a system clock signal SCK and is converted to an n-bit digital video signal Si by an analog/digital converter for the operation according to the present invention.

Figure 1:
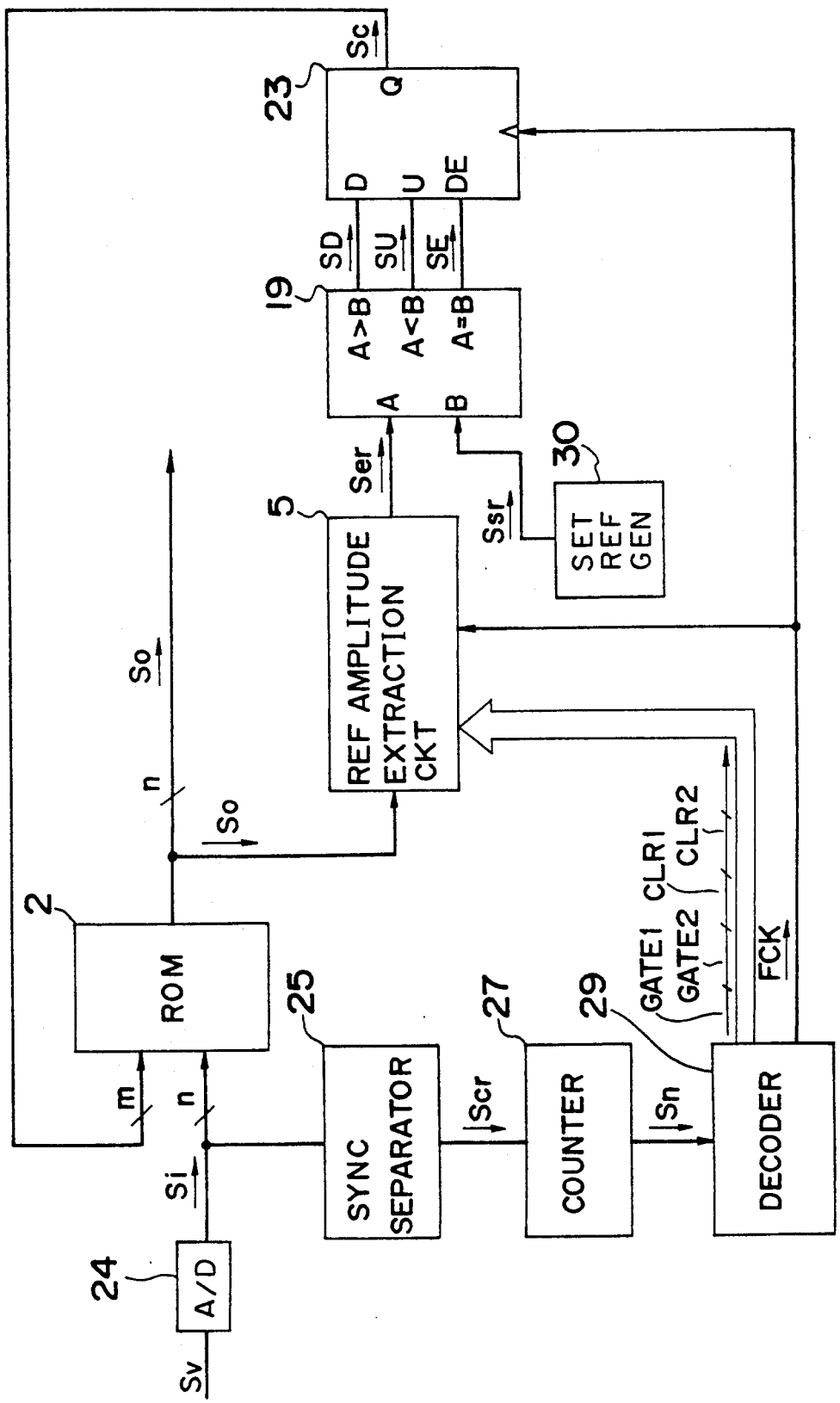
FIG. 1 is a block diagram of the amplitude control device according to the preferred embodiment of the present invention.

Referring to FIG. 1, an amplitude control device for controlling the amplitude of the digital video signal Si according to the present invention is shown. The amplitude control device Ac includes an analog-digital converter 24 which converts the analog video signal Sv to the digital video signal Si, and a synchronizing signal separator 25 which extracts the horizontal synchronizing signal SH from the digital video signal Si and produces a counter reset signal Scr after every one frame period.

Upon receipt of the counter reset signal Scr, a counter 27 is reset and starts counting numbers from zero and produces a count signal Sn representing the counted number.

Upon receipt of the count signal Sn, a decoder 29 produces a first gate signal GATE 1, a second gate signal GATE 2, a first clear signal CLR 1, a second clear signal CLR 2, and a field clock signal FCK at predetermined timed sequence, as shown in FIG. 4. The first gate signal GATE 1 has a pulse appearing once in each field, such that the first gate signal GATE changes from low to high at time t22 and returns to low at time t30. The second gate signal GATE 2 has a pulse appearing once in each field, such that the second gate signal GATE 2 changes from low to high at time t2 and returns to low at time t10. The first clear signal CLR1 has a pulse appearing once in each field such that the first clear signal CLR1 changes from low to high at time t21 and returns to low at time t22. The second clear signal CLR2 has a pulse appearing once in each field such that the first clear signal CLR2 changes from low to high at time t1 and returns to low at time t2. The field clock signal FCK has a pulse appearing in each field such that the field clock signal FCK changes from low to high at time t31 and returns low at time t32.

To have an access to ROM 2, (m+n) bit address is used in which the lower n bits are formed by the digital video signal Si and the upper m bits are formed by a counter signal Sc. Then, ROM 2 produces an n-bit video signal So wherein the amplitude is adjusted. Details of the counter signal Sc will be described later. In the ROM 2, digital video signal Si multiplied by various coefficients are stored. A value equal to the lower n-bit address (digital video signal Si) multiplied by a coefficient selected by the upper m-bit address is stored in a memory cell specified by an address (m, n). In effect, the ROM 2 operates as a multiplier varying the multiplication coefficient according to the value of upper m-bit address. From another viewpoint, ROM 2 serves as a digital level controller regulated by the upper m-bit address. The relationship between the coefficients and the address will be described in details later with reference to Table 1.

A reference amplitude extraction circuit 5 receives the gate signals GATE 1 and GATE 2, clear signals CLR 1 and CLR 2, and field clock signal FCK and extracts the reference amplitude Ra from the controlled video signal So to produce a reference amplitude signal Ser.

Figure 2:
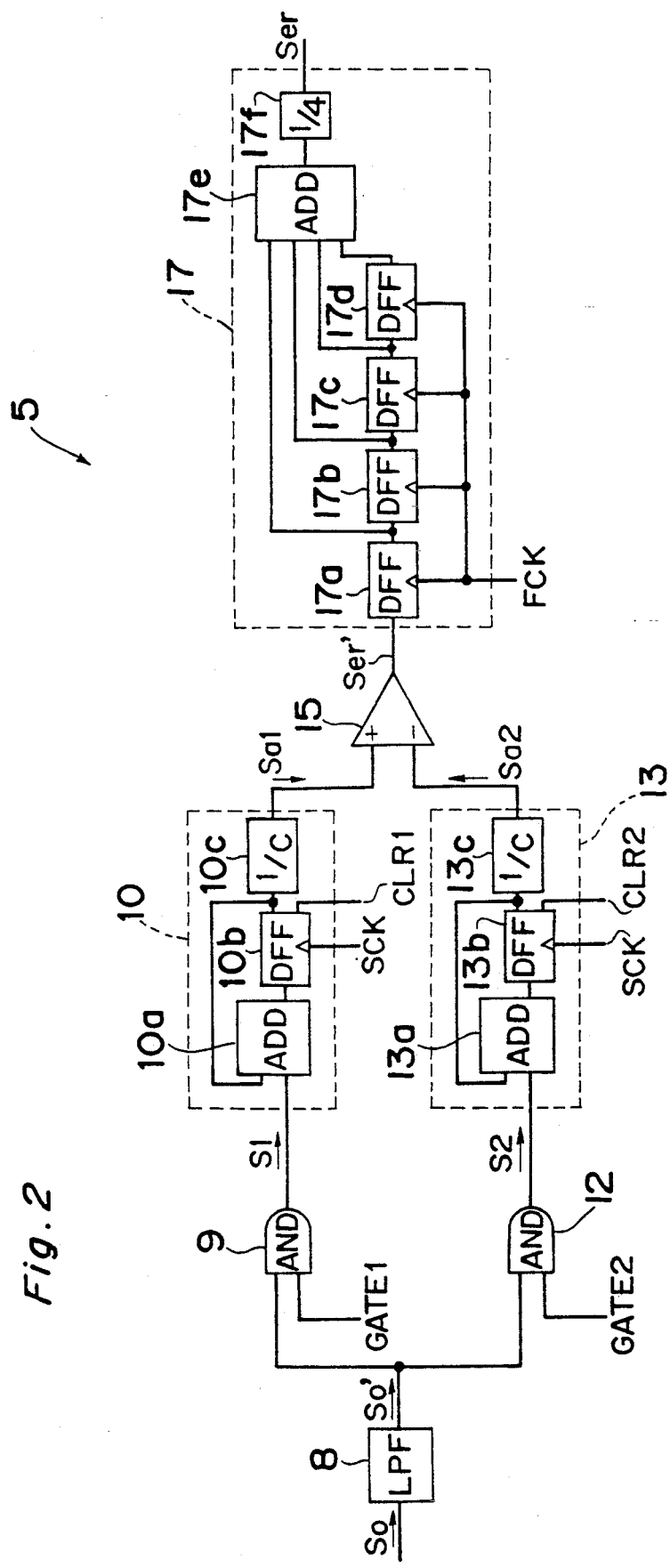
FIG. 2 is a block diagram of the reference amplitude extracting circuit of the amplitude control device shown in FIG. 1.

Referring to FIG. 2, a detail of the reference amplitude extraction circuit 5 is shown. The reference amplitude extraction circuit 5 includes a low pass filter 8 for removing the noise component from the controlled video signal So to produce a noise reduced digital video signal So'. In FIG. 4, only the portion of reference signal SR of the noise reduced digital video signal So' is shown. The digital video signal So' changes from the second reference amplitude R2 to the first reference amplitude R1 at time t20. The amplitude control device Ac operates as synchronized with the system clock signal SCK.

A first AND circuit 9 is provided to produce a first amplitude signal S1 representing the first reference amplitude R1 based on the noise reduced digital video signal So' and the first gate signal GATE 1. Thus, the first amplitude signal S1 would be a pulse wave having the first reference amplitude R1 appearing at the same timing as that of the first gate pulse GATE 1, as shown in FIG. 4.

A first amplitude average circuit 10 is provided for producing a first averaged signal Sa1 based on the first amplitude signal S1. The first amplitude average circuit 10 has a first adder 10a, a first delay flip flop circuit 10b, and a first divider 10c. The first adder 10a has a first input port connected to the first AND circuit 9. The first delay flip flop circuit 10b has a first input port connected to an output of the first adder 10a, a reset port for receiving the first clear signal CLR1, a trigger port for receiving the system clock signal SCK, and an output port connected to a second input port of the first adder 10a. The first divider 10c is connected to the output of the first flip flop circuit 10b. It is to be noted that the first divider 10c reduces a signal amplitude to a value of the original amplitude divided by a constant "c". The constant "c" can be any positive integer which is the same as the number of system cycles involved in the first gate signal GATE 1 pulse length, and which would be eight in this embodiment.

The first delay flip flop circuit 10b is reset to output a zero amplitude signal to the first adder 10a and the first divider 10c at time t21 by the first clear signal CLR1.

At time t22, the zero amplitude signal is processed by the first divider 10c and is then output as the first averaged signal Sa1 from the first divider 10c. The other of these zero amplitude signals outputted by the first delay flip flop circuit 19b at time t21 is added to the first amplitude signal S1 having the first reference amplitude R1 (t22) and will be outputted to the first divider 10c through the first delay flip flop circuit 10b.

At time t23, the signal having the first reference amplitude R1 (t22) added by zero amplitude (t21) is outputted by the first delay flip flop circuit 10b to the first adder 10a and the first divider 10c. The first divider 10c produces the first averaged signal Sa1 by reducing the first reference amplitude R1 (t22) to one eighth. At the same time, the signal having the first reference amplitude R1 (t22) is added to the first amplitude signal S1 having the first reference amplitude R1 detected at time t23.

At time t24, the signal having the first reference amplitude R1 (t23) added by the first reference amplitude R1 (t22) is outputted to the first adder 10a and the first divider 10c through the first delay flip flop circuit 10b. The first divider 10c produces the first averaged signal Sa1 by reducing the first reference amplitude R1 (t23) added by the first reference amplitude R1 (t22) to one eighth.

Thus, the first averaged signals Sa1 having an averaged first amplitude R1 at time t22, t23, t24, t25, t26, t27, t28, t29, and t30 are obtained by subsequently adding the respective first amplitude R1 detected at time t21, t22, t23, t24, t25, t26, t27, t28, and t29 as the dominator for division by the divider 10c. After time t30, the first amplitude signal S1 is zero, the first averaged signal Sa1 produced at time 30 is continually employed as the first averaged signal Sa1 for subsequent operation.

The reference amplitude extraction circuit 5 further includes a second AND circuit 12 and a second amplitude average circuit 13 which are constructed similarly to the first ADD circuit 9 and the first average circuit 10, respectively. The second amplitude average circuit 13 has a second adder 13a, a second delay flip flop circuit 13b, and a second divider 13c. The second AND circuit 12 produces a second amplitude signal S2 which changes from zero to the second reference signal R2 at time t2 and returns to zero at time t10. The second average circuit 13 averages the amplitude of the second amplitude signal S2 for the period from t2 to t10 on receipt of the second clear signal CLR2 and produces the second averaged signal Sa2, as shown in FIG. 4.

The reference amplitude extraction circuit 5 further includes a subtractor 15 for producing a reference amplitude signal Ser' by subtracting the second averaged signal Sa2 (R2) from the first averaged signal Sa1 (R1). Thus the reference amplitude Ra between the fist and second reference amplitude R1 and R2 is extracted, as shown in FIG. 4.

The reference amplitude extraction circuit 5 further includes a smoothing circuit 17 which has third, forth, fifth, and sixth delay flip flop circuits 17a, 17b, 17c, and 17d in a series connection, a second adder 17e and a third divider 17f. Each of the sixth delay flip flop circuits 17a, 17b, 17c, and 17d receives the field clock signal FCK at a trigger port thereof for holding the data received to the input thereof until the next field clock signal FCK is applied. Therefore, the first delay flip flop circuit 17a holds the newest reference amplitude signal Ser' which is obtained in response to the latest field clock signal FCK. The second delay flip flop circuit 17b holds the one field old reference amplitude signal Ser'. Similarly, the third delay flip flop circuit 17c holds the two field old reference amplitude signal Ser', and the forth delay flip flop circuit 17d holds the three field old reference amplitude signal Ser'. Accordingly, the second adder 17e is simultaneously provided with four reference amplitude signals Ser' obtained in the present field, one previous field, two previous field and three previous field, respectively. The sum of these four reference amplitude signals Ser' as added in the second adder 17e is applied to the third divider 17f to obtain an average reference amplitude signal Ser. The reference amplitude signal Ser is renewed at time t31, once a field period of the video signal Sv, as shown in FIG. 4.

Referring back to FIG. 1, a comparator 19 is provided for comparing the extracted reference amplitude Ra (reference amplitude signal Ser) with a set reference signal Ssr to produce one of three signals according to the result of the comparison as follows. It is to be noted that the set reference signal Ssr as generated from a set reference generator 30 represents a set reference amplitude Rs which is predetermined by the designer in consideration of the desirable characteristics of the amplitude control device Ac. When the extracted reference amplitude Ra is greater than the set reference amplitude Rs, a count down signal SD is produced. Similarly, when the extracted reference amplitude Ra is greater than the set reference amplitude Rs, a count up signal SU is produced, and when the extracted reference amplitude Ra is equal to the set reference amplitude Rs, a count stop signal SE is produced.

An up/down counter 23 has first and second, and third terminals D, U, and DE for receiving the count down signal SD, count up signal SU, and count stop signal SE, respectively, and a terminal for receiving the filed clock signal FCK. On receipt of signal SD, SU, or SE, the up/down counter 23 counts down, counts up, and or holds the counting, respectively, and produces the counter signal Sc. When A=B, up/down counter 23 is maintained at a neutral level which is, according to the example shown in Table 1, "32". When A>B, up/down counter 23 is decremented, and when A<B, up/down counter 23 is incremented. The up/down counter 23 operates as synchronized with the detection of the reference amplitude signal Ser by means of the field clock signal FCK.

As is clear from the above, the counter signal Sc varies according to the controlled video signal So from the ROM 2 such that the counter signal Sc value decreases when the extracted reference amplitude Ra is greater than the set reference amplitude Rs, is held constant when the extracted reference amplitude Ra and the set reference amplitude Rs are equal, and increases when the extracted reference amplitude Ra is less than the set reference amplitude Rs.

As shown in Table 1, ROM 2 is stored with a table of various amplitude data.

TABLE 1

| Multiplication Coefficient | High 6 bit | Low 8 bit | | | | | | |
|---|---|---|---|---|---|---|---|---|
| | | 255 | ... | 200 | ... | 100 | ... | 0 |
| 1.194 | 63 | 255 | ... | 238 | ... | 119 | ... | 0 |

TABLE 1-continued

| Multiplication Coefficient | High 6 bit | Low 8 bit | | | | | | |
|---|---|---|---|---|---|---|---|---|
| | | 255 | ... | 200 | ... | 100 | ... | 0 |
| ... | ... | ... | ... | ... | ... | ... | ... | ... |
| 1.100 | 48 | 255 | ... | 220 | ... | 110 | ... | 0 |
| ... | ... | ... | ... | ... | ... | ... | ... | ... |
| 1.006 | 33 | 255 | ... | 201 | ... | 101 | ... | 0 |
| 1.000 | 32 | 255 | ... | 200 | ... | 100 | ... | 0 |
| 0.994 | 31 | 253 | ... | 199 | ... | 99 | ... | 0 |
| ... | ... | ... | ... | ... | ... | ... | ... | ... |
| 0.900 | 16 | 230 | ... | 180 | ... | 90 | ... | 0 |
| ... | ... | ... | ... | ... | ... | ... | ... | ... |
| 0.800 | 0 | 204 | ... | 160 | ... | 80 | ... | 0 |

When the counter signal Sc value is at the neutral level, i.e., at "32", the multiplication coefficient is 1.00. Therefore, ROM 2 produces the output digital video signal So without any change in the amplitude from the input digital video signal Si. When the counter signal Sc value is increased to, e.g., "33" due to the comparison result A<B, ROM 2 produces the output digital video signal So which is increased by 1.006 times the input digital video signal Si. As shown in Table 1, ROM 2 carries various output values which are equal to 1.006 times the various input digital video signals Si. Therefore, when the input digital video signal Si and the counter signal Sc are applied to ROM 2 as an address, an output digital video signal So is immediately taken out from the table without any calculation.

When the counter signal Sc value is decreased to, e.g., "31" due to the comparison result A>B, ROM 2 produces the output digital video signal So which is decreased by 0.994 times the input digital video signal Si.

In this manner, when the counter signal Sc value decreases from "32", the multiplication coefficient of the ROM 2 input/output becomes smaller than "1". Thus, when the reference amplitude Ra of controlled video signal So is greater than the set reference amplitude Rs, the up/down counter 23 counts down, and the amplitude of the input digital video signal Si is reduced in ROM 2 to approach the set amplitude. As apparent from the forgoing, a feedback control is used to maintain the amplitude of the output signal equal to the predetermined set reference amplitude level Rs.

It is to be noted that the amplitude control device Ac may be so arranged as to produce the count down signal SD when A>B and count up signal SU when A≦B. If this arrangement is taken, the amplitude becomes unstable when A=B is obtained. It is therefore preferable to use the count stop signal SE to stabilize the amplitude control operation.

What determines the condition of the amplitude control operation in this invention is the bit capacity of the ROM 2, how the multiplication coefficient is set, and the frequency of the filed clock signal FCK. Therefore, if these values are optimized during the design of the amplitude control device Ac, adjustment such as required with analog systems is not necessary to obtain an optimum operating state. There is also no direct effect on the analog/digital conversion operation because the amplitude control circuit operates independently of the A/D converter.

It is to be noted that while the above description of the invention referred specifically to the processing of a video signal, it shall not be so limited and can be applied to a wide range of digital signals obtained by A/D conversion of an analog audio signal, sensor signal, and other electrical signals with a time-base multiplexed amplitude reference signal component.

As described hereinabove, high performance can be obtained without requiring adjustment after assembly, and circuit integration is made easier because signal amplitude control is achieved by pure digital processing using ROM and up/down counter devices. Significant practical effectiveness can therefore be obtained by incorporating this amplitude control circuit into the A/D conversion component of digital audio-visual equipment.

In addition, the amplitude reference signal was described as being multiplexed to the vertical blanking period of the video signal in the above description, but the horizontal blanking period or any other video signal period such as line, field, and frame cycles also can be used for amplitude reference signal multiplexing.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An amplitude control device for controlling an amplitude of a data signal having an reference amplitude, said device comprising:

an analog-digital conversion means for converting said data signal to an n-bit digital signal;
    an amplitude extraction means for extracting said reference amplitude from said n-bit digital signal;
    a comparison means for comparing said extracted reference amplitude with a predetermined reference amplitude, and producing a first comparison signal when said extracted reference amplitude is greater than said predetermined reference amplitude, and a second comparison signal when said extracted reference amplitude is smaller than said predetermined reference amplitude;
    a counter means for counting up on receipt of said first comparison signal and counting down on receipt of said second comparison signal, and for producing an m-bit digital signal representing said counting result; and
    a memory means for storing a table in which said n-bit digital signal and said m-bit digital signal are used as an address for designating a value equal to said n-bit digital signal multiplied by a coefficient determined by said m-bit digital signal.

2. An amplitude control device as claimed in Claim 1, wherein said comparison means further produces a third comparison signal when said extracted reference amplitude is equal to said predetermined reference amplitude, and wherein said counter means suspends the counting on receipt of said third comparison signal.

* * * * *